(12) United States Patent
Lee

(10) Patent No.: US 7,215,411 B2
(45) Date of Patent: May 8, 2007

(54) METHOD OF EXPOSING WAFER USING SCAN-TYPE EXPOSURE APPARATUS

(75) Inventor: Dong-Han Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 366 days.

(21) Appl. No.: 10/982,317

(22) Filed: Nov. 4, 2004

(65) Prior Publication Data
US 2005/0103260 A1   May 19, 2005

(30) Foreign Application Priority Data
Nov. 14, 2003   (KR) .................. 10-2003-0080575

(51) Int. Cl.
G03B 27/32 (2006.01)
G03B 27/42 (2006.01)
G03C 5/00 (2006.01)

(52) U.S. Cl. .................... 355/77; 355/53; 430/311
(58) Field of Classification Search ............... 355/53, 355/77; 430/311
See application file for complete search history.

(56) References Cited

U.S. PATENT DOCUMENTS 5,483,311 A * 1/1996 Sakakibara et al. ........... 355/53
5,617,182 A * 4/1997 Wakamoto et al. ........... 355/53
6,674,509 B2 * 1/2004 Suzuki ........................ 355/53
6,809,798 B1 * 10/2004 Fujita ......................... 355/53

FOREIGN PATENT DOCUMENTS

| JP | 2000-260696 | * | 9/2000 |
| JP | 2001-230170 | | 8/2001 |
| KR | 10-0334852 | | 4/2002 |

OTHER PUBLICATIONS

English language abstract of the Korean Publication No. 10-0334852.
English language abstract of the Japanese Publication No. 2001-230170.

* cited by examiner

Primary Examiner—Alan Mathews
(74) Attorney, Agent, or Firm—Marger Johnson & McCollom, P.C.

(57) ABSTRACT

Provided is a method of exposing a wafer using a scan-type exposure apparatus. The method includes scan exposing a first shot selected from a first shot column formed of an array of shots disposed in a row in a first direction. The first shot column may be included in a plurality of shots repeatedly formed in the first direction and a second direction that are substantially orthogonal to each other in an exposure target area on the wafer. The method further includes scan exposing a second shot that is included in a second shot column and disposed in a diagonal direction to the first shot. The second shot column may be formed of an array of shots disposed in a row in the first direction and is closer to the first shot column than any other shot in the plurality of shots.

20 Claims, 4 Drawing Sheets

METHOD OF EXPOSING WAFER USING SCAN-TYPE EXPOSURE APPARATUS

BACKGROUND OF THE INVENTION

This application claims the priority of Korean Patent Application No. 2003-0080575, filed on Nov. 14, 2003, in the Korean Intellectual Property Office, the disclosure of which is hereby incorporated by reference in its entirety.

1. Field of the Invention

The present invention relates to a method of manufacturing a semiconductor device, and more particularly, to a method of exposing a wafer using a scan-type exposure apparatus.

2. Description of the Related Art

In general, photolithographic processes are used to manufacture semiconductor devices. During the photolithographic process, a photosensitive film is coated on a wafer used to form a fine circuit pattern, a pattern of a predetermined shape formed on a mask is transferred onto the wafer by projecting light to the mask using an exposure apparatus. Thus, the pattern is formed on the wafer.

Recently, a scan-type exposure apparatus that performs exposure by moving a reticle and a wafer in opposite directions to each other has been developed as one of exposure apparatuses used in a photolithography technology to manufacture semiconductor devices.

In the scan-type exposure apparatus, to perform an exposure process, a reticle is moved in a certain direction while being fixed to a reticle stage in the lower portion of an illuminating system that projects light having a predetermined wave length. A projective optical system is disposed in the lower portion of the reticle stage. A wafer stage is disposed in the lower portion of the projective optical system. The wafer moves in the opposite direction to the reticle stage while being fixed to the wafer stage. The light generated by the illuminating system passes through the reticle and the projective optical system and reaches the wafer such that the exposure process is performed on a semiconductor chip formed on the wafer.

Typically, in the scan-type exposure apparatus, to expose one of exposure target areas on the wafer, i.e., one shot, a scanner initially undergoes acceleration and pre-scanning steps. In the acceleration step, the scanner is accelerated in the direction of scanning until the speed of the scanner reaches a desired scanning speed. In the pre-scanning step, the scanner is settled and leveled to stably scan the shot at a constant speed after termination of the acceleration step and before exposure of the shot and operates while controlling exposure conditions.

FIG. 1 is a view explaining a wafer exposing method in a scan-type exposure apparatus according to conventional art. Referring to FIG. 1, in the wafer exposing method according to conventional art, to expose a plurality of shots S that form an exposure target area 10 on a wafer W, an array of shots extended in a certain direction, e.g., a first shot column Sc1 that is formed of an array of shots S1, S2, S3, S4, S5, . . . extending in the x-direction, is first exposed. During exposure of the first shot column Sc1, the shots that form the first shot column Sc1 are each scan exposed sequentially in the y-direction indicated by arrows 12. After all of the shots of the first shot column Sc1 is exposed, shots that form a second shot column Sc2 that is adjacent to the first shot column Sc1 are each scan exposed sequentially in the y-direction in the same manner as the first shot column Sc1.

FIG. 2 is a view for explaining a scanner's scanning distance required for exposing shots formed on a wafer in the wafer exposing method described with reference to FIG. 1.

Referring to FIG. 2, according to conventional art, the scanner undergoes an acceleration section (distance a) and a pre-scanning section (distance b) and scan exposing a section (distance c) corresponding to a y-direction distance of a first shot S1. Then, the scanner further undergoes a post-scanning section (distance b) to move to a pre-scanning start position P, so as to start exposing a second shot S2 that is the next shot to be exposed. Here, the total scanning distance of the scanner for exposing two shots is equal to 4a+4b+2c.

The post-scanning section is not related to controlling the exposure conditions (in contrast to the pre-scanning section), and is simply intended to move the scanner to the pre-scanning start position P. Therefore, in the wafer exposing method according to conventional art, the post-scanning section that is not necessarily required for the exposure process in practice is added to the scanning distance of the scanner. As a result, the scanning distance for exposure and the amount of time required for exposing a semiconductor chip will substantially increase, causing degradation of productivity in the exposure process.

SUMMARY OF THE INVENTION

The present invention provides a method of exposing a wafer using a scan-type exposure apparatus, which improves productivity in an exposure process by minimizing a scanning distance of a scanner.

According to one aspect of the present invention, there is provided a method of exposing a wafer, the method comprising scan exposing a first shot selected from a first shot column formed of an array of shots disposed in a row in a first direction, wherein the first shot column is included in a plurality of shots repeatedly formed in the first direction and a second direction that are substantially orthogonal to each other in an exposure target area on the wafer; and scan exposing a second shot that is included in a second shot column and disposed in a diagonal direction to the first shot, wherein the second shot column is formed of an array of shots disposed in a row in the first direction and is closer to the first shot column than any other shot in the plurality of shots.

The first shot may be scan exposed in the second direction from the first shot column towards the opposite direction to the second shot column, and the second shot may be scan exposed in the second direction from the second shot column towards the opposite direction to the first shot column.

The method further comprises after the scan exposing of the second shot, scan exposing a third shot that is disposed in a diagonal direction to the second shot and is spaced apart from the first shot by one shot.

Each of the array of shots forming the first shot column is scan exposed in the second direction, and in the first shot column, shots that are alternatively selected from the array of shots disposed in the first direction are exposed. The method may further comprise before the scan exposing of each of the array of shots forming the first shot column, pre-scanning that starts in the second shot column and progresses in the second direction. A scanning distance in the pre-scanning may be less than or equal to a scanning distance required for the scan exposing of each of the array of shots forming the first shot column.

Each of the array of shots forming the second shot column is scan exposed in the second direction, and in the second shot column, shots that are alternatively selected from the array of shots disposed in the first direction are exposed. The method may further comprise before the scan exposing of each of the array of shots forming the second shot column, pre-scanning that starts in the first shot column and progresses in the second direction. A scanning distance in the pre-scanning may be less than or equal to a scanning distance required for the scan exposing of each of the array of shots forming the second shot column. According to the present invention, when a scanner is moved to expose the next shot after one shot is scan exposed on a wafer, a post-scanning section is removed, thereby reducing the total scanning distance required for wafer exposure when compared to conventional art. Therefore, according to an embodiment of the present invention, it is possible to reduce the total amount of time required for exposure and improve productivity in the exposure process by removing an unnecessary scanning distance in the exposure process and reducing the scanning distance required for the exposure process.

BRIEF DESCRIPTION OF THE DRAWINGS

The above and other aspects and advantages of the present invention will become more apparent by describing in detail an exemplary embodiment thereof with reference to the attached drawings in which.

DETAILED DESCRIPTION OF THE INVENTION

Figure 1:
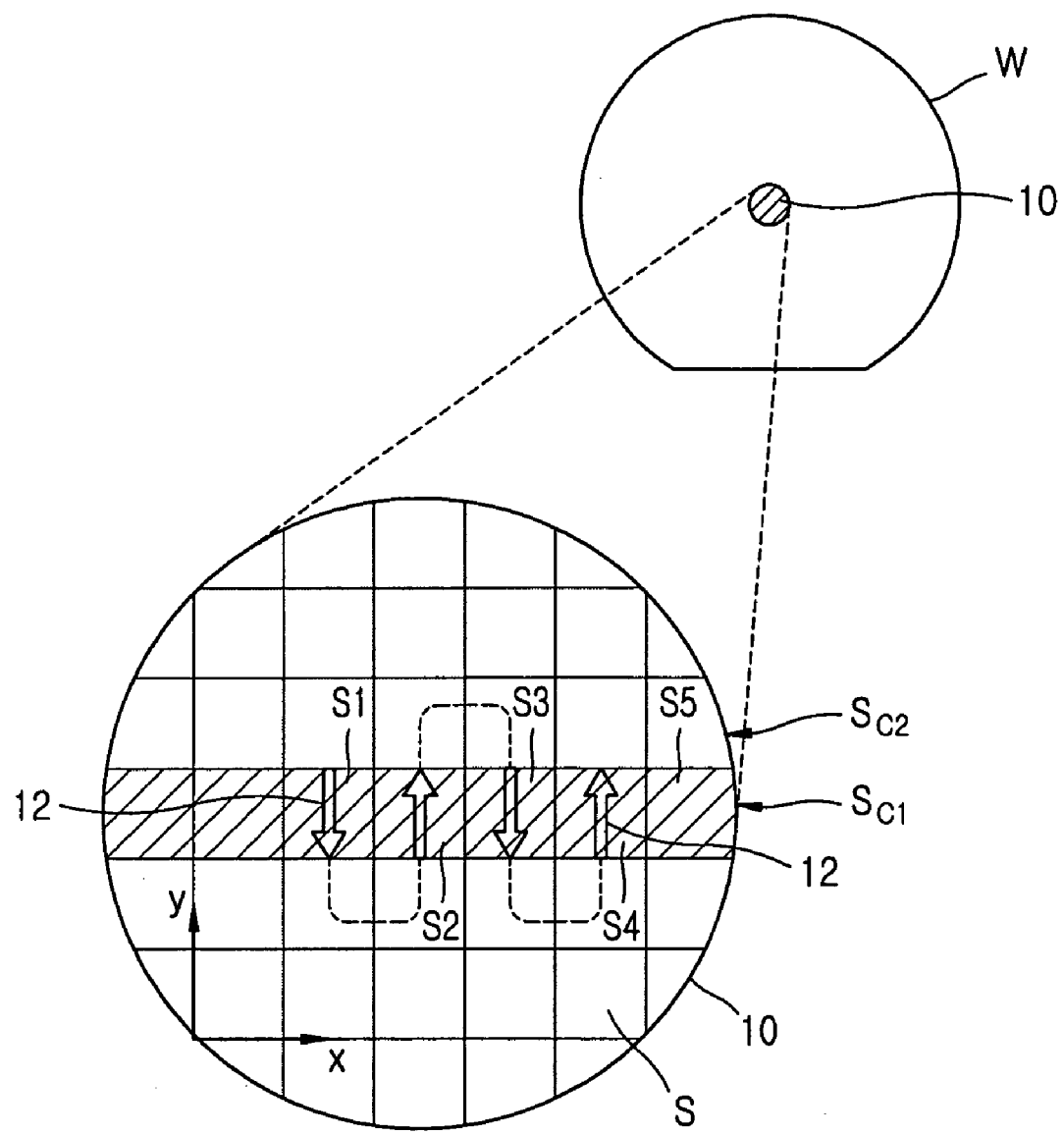
FIG. 1 is a view for explaining a wafer exposing method in a scan-type exposure apparatus according to conventional art.

The present invention will now be described more fully with reference to the accompanying drawings, in which an embodiment of the invention is shown. Throughout the drawings, like reference numerals are used to refer to like elements.

Figure 3:
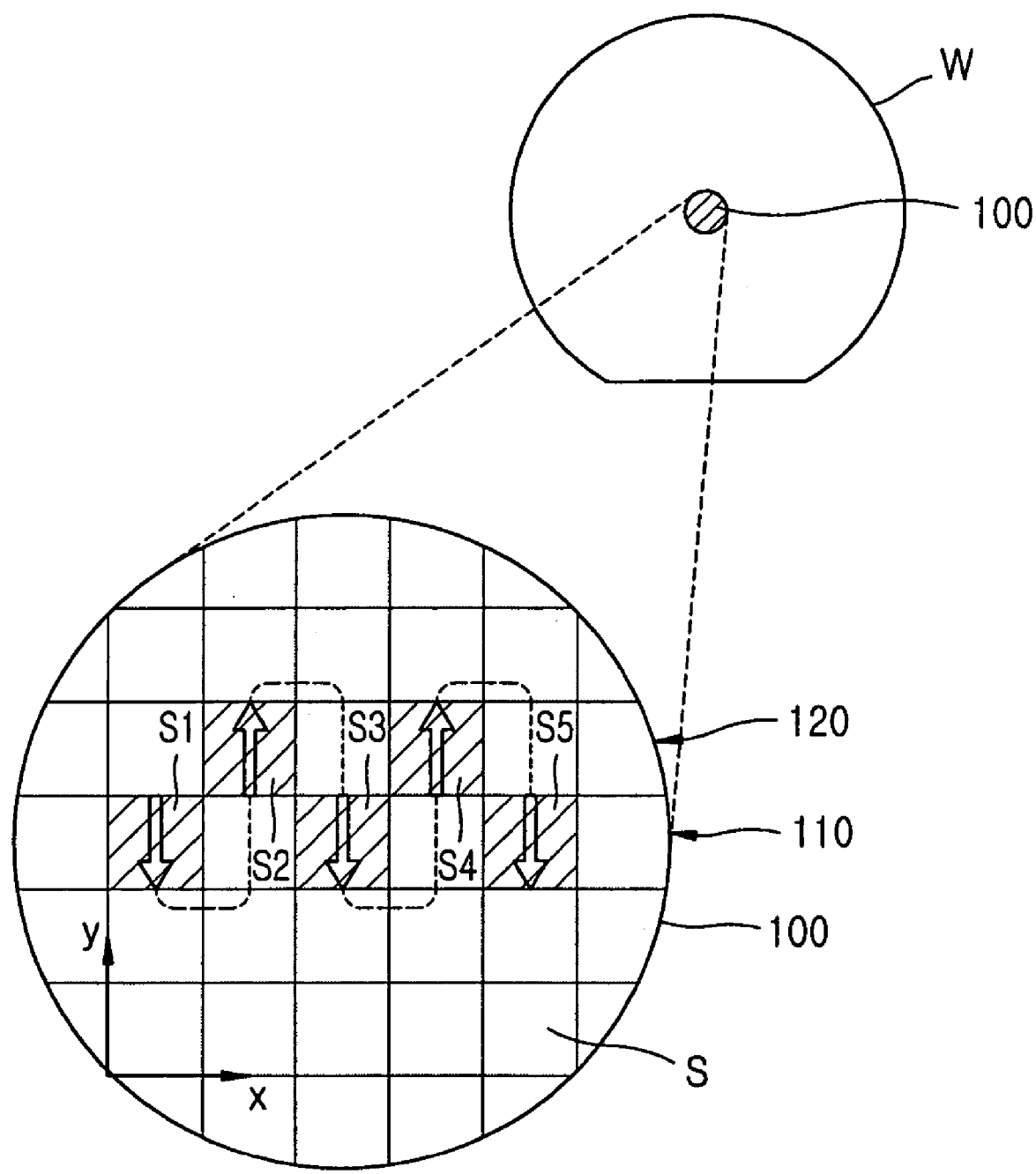
FIG. 3 is a view for explaining a method of exposing a wafer in a scan-type exposure apparatus according to a preferred embodiment of the present invention.

FIG. 3 is a view for explaining a method of exposing a wafer in a scan-type exposure apparatus according to a preferred embodiment of the present invention. Referring to FIG. 3, in the method of exposing a wafer W according to the present invention, a plurality of shots S formed repeatedly along a first direction (x-direction) and a second direction (y-direction) are orthogonal to each other in an exposure target area 100 on the wafer W. A first shot S1 selected from a first shot column 110 is first scan exposed. The first shot column 110 is formed of an array of shots disposed in a row in the x-direction. After the first shot S1 is scan exposed, a second shot S2 that is included in a second shot column 120 is disposed in a diagonal direction to the first shot S1 is scan exposed The second shot column 120 is closer to the first shot column 110 than any other shot in the plurality of shots S and is formed of an array of shots disposed in a row in the x-direction. After the second shot S2 is scan exposed, a third shot S3 of the first shot column 110 is scan exposed. The third shot S3 is disposed in a diagonal direction to the second shot S2 and is spaced apart from the first shot S1 by one shot. After the third shot S3 is scan exposed, a fourth shot S4 of the second shot column 120 and a fifth shot S5 of the first shot column 110 are sequentially scan exposed in the similar manner. After the shots of the first shot column 110 and the second shot column 120 are alternately exposed in this way, scan exposure is performed on the next shot column to be exposed. At this time, the first shot column 110 and the second shot column 120 may be selected again and unexposed shots of the first shot column 110 and the second shot column 120 may be scan exposed. Alternatively, another shot column other than the first shot column 110 and the second shot column 120 may be selected, and exposure target shots of the selected shot column may be exposed.

Here, each of exposure target shots of the first shot column 110, including the first shot S1, the third shot S3, the fifth shot S5, etc., is scan exposed in the y-direction from the first shot column 110 towards the opposite direction to the second shot column 120, and each of exposure target shots of the second shot column 120 including the second shot S2, the fourth shot S3, etc., is scan exposed in the y-direction from the second shot column 120 towards the opposite direction to the first shot column 110. In other words, each of the exposure target shots of the first shot column 110 is scan exposed in the y-direction, and in the first shot column 110, shots that are alternately selected from the array of shots disposed in a row in the x-direction are sequentially exposed. Like the first shot column 110, each of the exposure target shots of the second shot column 120 is scan exposed in the y-direction, and in the second shot column 120, shots that are alternately selected from the array of shots disposed in a row in the x-direction are sequentially exposed.

Figure 4:
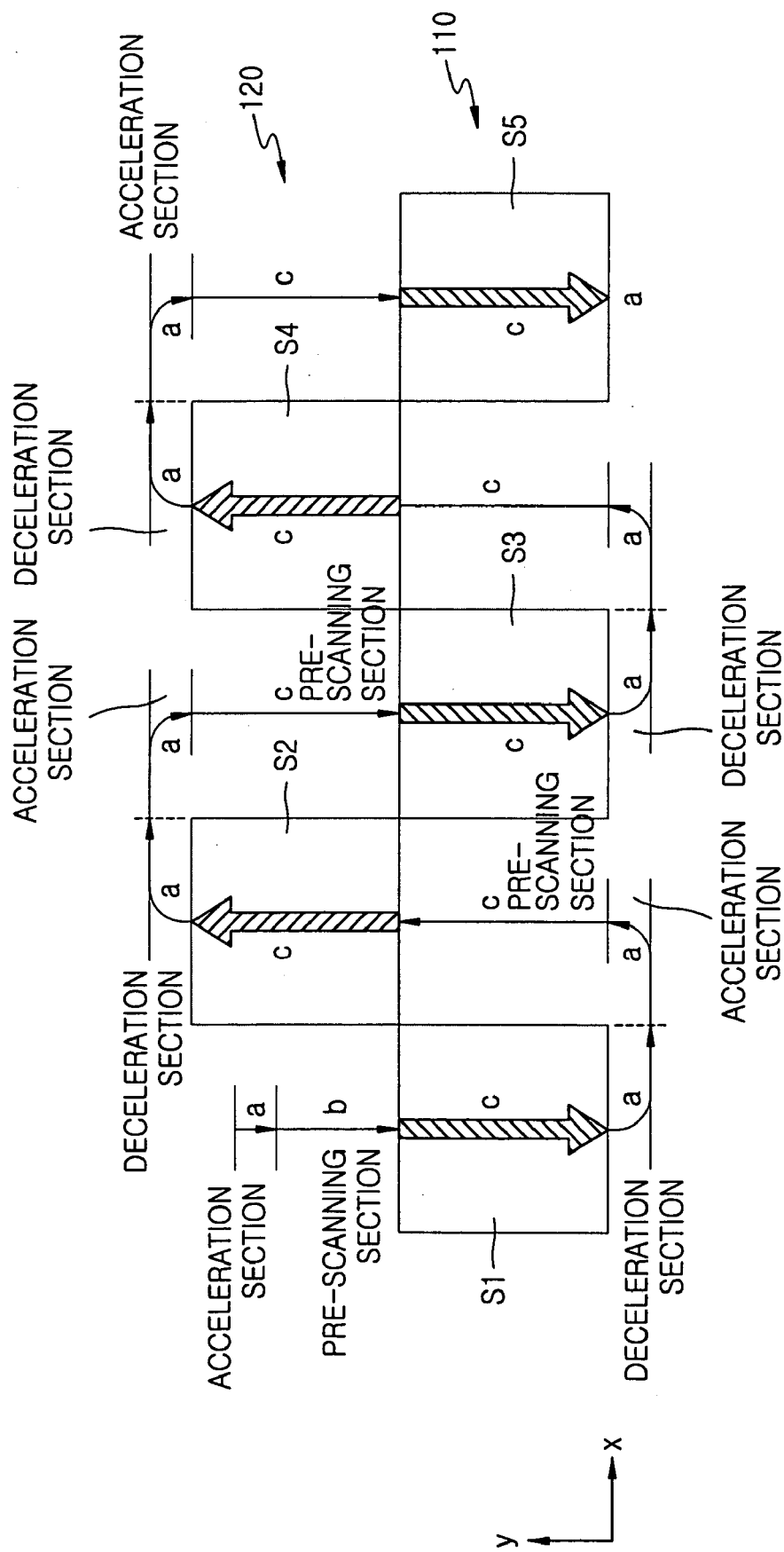
FIG. 4 is a view for explaining a scanner's scanning distance required for exposing shots formed on a wafer in the method of exposing a wafer according to the present invention.

Referring to FIG. 4, in the method of exposing the wafer according to the present invention, before each of the exposure target shots that form the first shot column 110 is scan exposed, a pre-scanning step that starts in the second shot column 120 is performed in the y-direction, i.e., in the same direction as the direction of scan exposure. Similarly, before each of the exposure target shots that form the second shot column 120 is scan exposed, a pre-scanning step that starts in the first shot column 110 is performed in the y-direction, i.e., in the same direction as the direction of scan exposure.

A scanning distance in the pre-scanning step may be equal to or less than a scanning distance c required for scan exposure of the shots S1, S3, S5, etc., that form the first shot column 110. For example, in the case of a shot that is first selected for scan exposure from the array of shots that forms the first shot column 110, i.e., in the case of the first shot S1, a scanning distance b in the pre-scanning step may be set to be less than the scanning distance c required for scan exposure of the first shot S1. In the case of the second shot S2 that is scan exposed after scan exposure of the first shot S1, pre-scanning is substantially performed along a scanning path along which a scanner moves to scan expose the second shot S2 after scan exposing the first shot S1. Thus, before the second shot S2 is scan exposed, it is possible to secure the scanning distance c for pre-scanning which is the same as a distance needed for the scanner to pass through a shot on which scan exposure is skipped after the first shot S1 is scan exposed in the first shot column 110, i.e., a shot immediately next to the first shot S1. Likewise, in the case of the third shot S3, the fourth shot S4, the fifth shot S5, etc., that are to be scan exposed after the second shot S2, the scanning distance c is substantially secured for pre-scanning. In such scan exposure, to scan expose a first selected shot on a wafer, a scanning distance in the pre-scanning step performed before scan exposure of the selected shot may be set to be less than a scanning distance required for scan exposure of the selected shot. To scan expose exposure target shots that are selected after the first selected shot, the scanning distance in the pre-scanning step performed before scan exposure of the selected exposure target shots may be set to be the same as the scanning distance required for scan exposure of the selected exposure target shots.

Prior to the pre-scanning step, a predetermined acceleration section (distance a) is needed. After scan exposure of shots, a predetermined deceleration section (distance a) is needed. However, the post-scanning section necessary to conventional art is not needed in the present invention.

Figure 2:
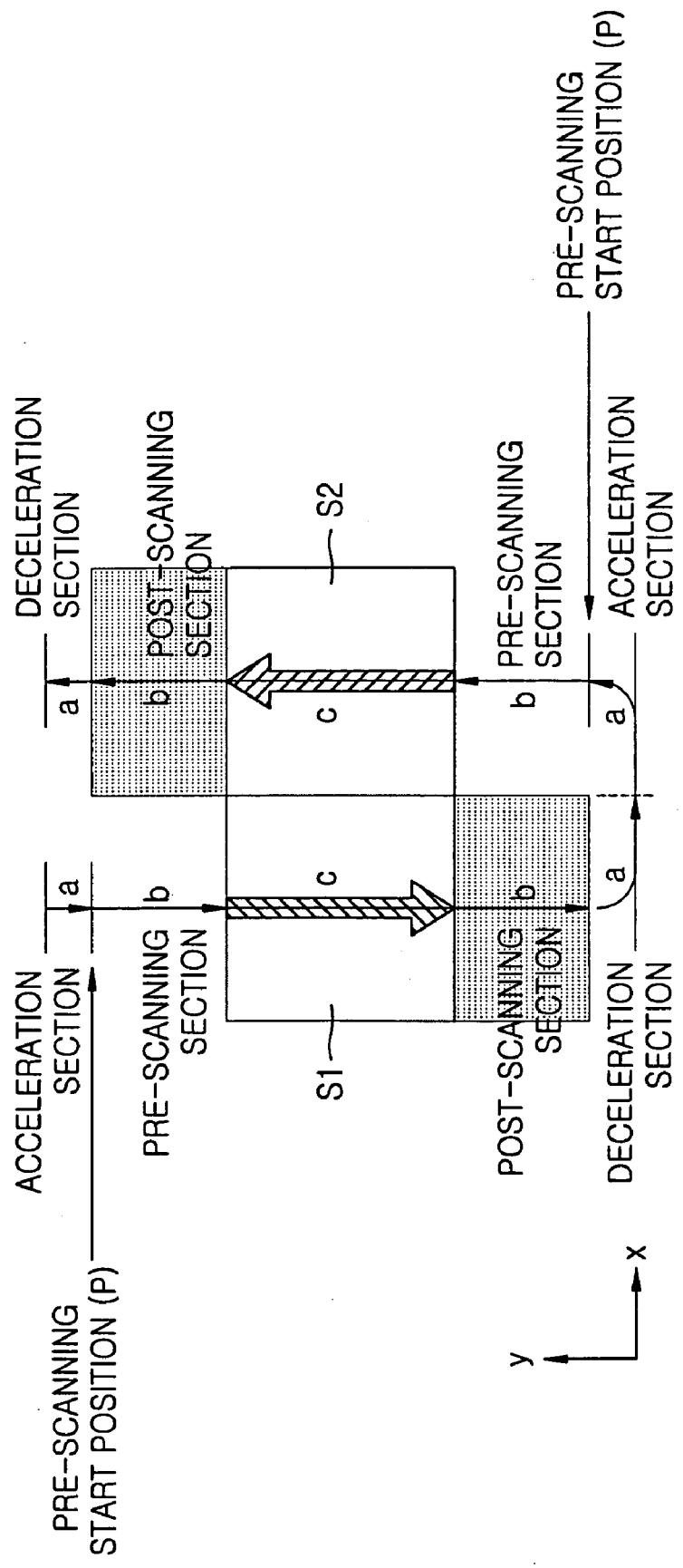
FIG. 2 is a view for explaining a scanner's scanning distance required for exposing shots formed on a wafer in the wafer exposing method described with reference to FIG. 1.

In the method of exposing the wafer W according to the present invention, the total scanning distance required for scan exposing first two shots is equal to 4a+b+3c. When comparing this total scanning distance to a total scanning distance of 4a+4b+2c according to conventional art described with reference to FIGS. 1 and 2, there exists a difference of 3b−c between the scanning distances of the method of exposing the wafer according to the present invention and the wafer exposing method according to conventional art. Here, the difference is not affected by the acceleration section (distance a) and the deceleration section (distance a), but is affected by the post-scanning section (distance b) according to conventional art and the scanning distance c. If the scanning distance c is not 3 times greater than the post-scanning section (distance b) adopted in conventional art (i.e., if 3b−c>0), the scanning distance c in the method of exposing the wafer according to the present invention can be reduced when compared to conventional art. In general, in the case of currently used scanners, the post-scanning section (distance b) is greater than about 15 mm and a scan exposure distance of each shot is not greater than 36 mm. As a result, a case 3b−c≦0 does not occur. Thus, in the method of exposing the wafer according to the present invention, the scanning distance can be reduced when compared to conventional art.

Also, in the method of exposing the wafer according to the present invention, when a plurality of shots, i.e., N shots (here, N is a whole integer), is exposed, a total scanning distance is equal to N (2a+2c)+b. In contrast, in the wafer exposing method according to conventional art, when a plurality of shots, i.e., N shots (here, N is a whole integer), is exposed, a total scanning distance is equal to N (2a+2b+c). Here, there exists a difference of N (2b−c)−b between the scanning distances of the method of exposing the wafer according to the present invention and the wafer exposing method according to conventional art. Therefore, in the case of a wafer having N shots that is generally used in semiconductor manufacturing processes, if 2b>c, the scanning distance can be reduced by performing exposure according to the method of exposing the wafer of the present invention. In most of the currently used scanners, two times of the post-scanning distance b is greater than an exposure distance of one shot. In this regard, the total scanning distance required for exposing the wafer can be reduced according to the present invention when compared to conventional art.

In the method of exposing the wafer according to the present invention, instead of sequentially exposing each shot of a first shot column, formed of an array of shots disposed in a first direction, where the first shot column is selected from a plurality of shots repeatedly formed in a row in a first direction and a second direction that are orthogonal to each other on an exposure target area of the wafer, a first shot selected from the first shot column is scan exposed, and then a second shot that is included in a second shot column and disposed in a diagonal direction to the first shot is scan exposed. The second shot column is closer to the first shot column than any other shot in the plurality of shots, and is formed of an array of shots disposed in a row in the first direction.

According to the method of exposing the wafer of the present invention, by removing a post-scanning section when a scanner moves to expose the next exposure target shot after scan exposing one shot on the wafer, the total scanning distance required for exposure of the wafer can be reduced when compared to conventional art. Thus, according to the present invention, it is possible to reduce the total amount of exposure needed to scan expose a plurality of semiconductor chips formed on a wafer sheet thereby improving productivity in the exposure process by removing an unnecessary scanning distance during the exposure process and minimizing the scanning distance required for the exposure process, respectively.

While the present invention has been particularly shown and described with reference to an exemplary embodiment thereof, it will be understood by those of ordinary skill in the art that various changes in form and details may be made therein without departing from the spirit and scope of the invention as defined by the appended claims and their equivalents.

What is claimed is:

1. A method of exposing a wafer, comprising:
   scan exposing a first shot selected from a first shot column formed of an array of shots disposed in a row in a first direction, wherein the first shot column is included in a plurality of shots repeatedly formed in the first direction and a second direction that are substantially orthogonal to each other in an exposure target area on the wafer; and
   scan exposing a second shot that is included in a second shot column and disposed in a diagonal direction to the first shot, wherein the second shot column is formed of an array of shots disposed in a row in the first direction and is closer to the first shot column than any other shot in the plurality of shots.

2. The method of claim 1, wherein the first shot is scan exposed in the second direction from the first shot column in an opposite direction to the second shot column, and the second shot is scan exposed in the second direction from the second shot column in an opposite direction to the first shot column.

3. The method of claim 1, further comprising, after scan exposing the second shot, scan exposing a third shot that is disposed in a diagonal direction to the second shot and is spaced apart from the first shot by one shot.

4. The method of claim 1, wherein each of the array of shots forming the first shot column is scan exposed in the second direction, and in the first shot column, shots that are alternatively selected from the array of shots disposed in the first direction are exposed.

5. The method of claim 4, further comprising, before the scan exposing of each of the array of shots forming the first shot column, pre-scanning beginning in the second shot column and progressing in the second direction.

6. The method of claim 5, wherein a scanning distance in the pre-scanning step is equal to a scanning distance required for the scan exposing of each of the array of shots forming the first shot column.

7. The method of claim 5, wherein a scanning distance in the pre-scanning is less than a scanning distance required for the scan exposing of each of the array of shots forming the first shot column.

8. The method of claim 1, wherein each of the array of shots forming the second shot column is scan exposed in the second direction and, in the second shot column, shots that are alternatively selected from the array of shots disposed in the first direction are exposed.

9. The method of claim 8, further comprising, before the scan exposing of each of the array of shots forming the second shot column, conducting a pre-scanning in the first shot column, and then progressing in the second direction.

10. The method of claim 9, wherein a scanning distance in the pre-scanning step is equal to a scanning distance required for the scan exposing of each of the array of shots forming the second shot column.

11. The method of claim 9, wherein a scanning distance in the pre-scanning is less than a scanning distance required for the scan exposing of each of the array of shots forming the second shot column.

12. The method of claim 1, further comprising, after the scan exposing of the first shot, and before the scan exposing of the second shot, pre-scanning in an area ranging from the first shot column to the second shot.

13. The method of claim 12, wherein a scanning distance for the pre-scanning is less than a scanning distance for the scan exposing of the first shot.

14. The method of claim 12, wherein a scanning distance for the pre-scanning is equal to a scanning distance for the scan exposing of the first shot.

15. A method of exposing a wafer, comprising:
scan exposing a first shot selected from a first shot column formed of an array of shots disposed in a row in a first direction, wherein the first shot column is included in a plurality of shots repeatedly formed in the first direction and a second direction that are substantially orthogonal to each other in an exposure target area on the wafer; and
scan exposing a second shot that is included in a second shot column and disposed in a diagonal direction to the first shot, wherein the second shot column is formed of an array of shots disposed in a row in the first direction and is closer to the first shot column than any other shot in the plurality of shots, without post-scanning and moving to a pre-scanning start position so as to start exposing the next shot to be exposed.

16. The method of claim 15, wherein the first shot is scan exposed in the second direction from the first shot column in an opposite direction to the second shot column, and the second shot is scan exposed in the second direction from the second shot column in an opposite direction to the first shot column.

17. The method of claim 15, further comprising, after scan exposing the second shot, scan exposing a third shot that is disposed in a diagonal direction to the second shot and is spaced apart from the first shot by one shot.

18. The method of claim 15, wherein each of the array of shots forming the first shot column is scan exposed in the second direction, and in the first shot column, shots that are alternatively selected from the array of shots disposed in the first direction are exposed.

19. The method of claim 15, wherein each of the array of shots forming the second shot column is scan exposed in the second direction and, in the second shot column, shots that are alternatively selected from the array of shots disposed in the first direction are exposed.

20. The method of claim 15, further comprising, after the scan exposing of the first shot, and before the scan exposing of the second shot, pre-scanning in an area ranging from the first shot column to the second shot.

* * * * *